(12) United States Patent
Josephson et al.

(10) Patent No.: US 6,532,580 B1
(45) Date of Patent: Mar. 11, 2003

(54) IN-PLACE METHOD FOR INSERTING REPEATER BUFFERS IN AN INTEGRATED CIRCUIT

(75) Inventors: Jon Eric Josephson, Fort Collins, CO (US); Jeffrey P Witte, Ft Collins, CO (US); Rex Mark Petersen, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/507,034

(22) Filed: Feb. 18, 2000

(51) Int. Cl.[7] .............................................. G06F 17/50
(52) U.S. Cl. ............................ 716/10; 716/12; 716/2
(58) Field of Search ........................................ 716/1–21

(56) References Cited

U.S. PATENT DOCUMENTS

| | | | |
|---|---|---|---|
| 5,605,856 A | * 2/1997 | Goosen et al. | 438/24 |
| 5,859,999 A | 1/1999 | Morris et al. | 712/224 |
| 5,860,017 A | 1/1999 | Sharangpani et al. | 712/23 |
| 6,202,193 B1 | * 3/2001 | Emura et al. | 716/10 |
| 6,230,302 B1 | * 5/2001 | Gabele et al. | 716/6 |
| 6,230,304 B1 | * 5/2001 | Groeneveld et al. | 716/7 |
| 6,266,803 B1 | * 7/2001 | Scherer et al. | 716/12 |
| 6,269,466 B1 | * 7/2001 | Crafts | 716/1 |
| 6,308,307 B1 | * 10/2001 | Cano et al. | 716/8 |
| 6,397,375 B1 | * 5/2002 | Block et al. | 716/14 |

FOREIGN PATENT DOCUMENTS

| | | | | |
|---|---|---|---|---|
| JP | 04048779 A | * | 2/1992 | H01L/27/118 |
| JP | 07086413 A | * | 3/1995 | H01L/21/82 |

OTHER PUBLICATIONS

"Interactive Repeater Insertion Siulator (IRIS) System And Method," Application No. 09/329556, Filed Jun. 10, 1999, Inventor: John D. Wanek.

Wolfe, Alexander, "Patents Shed Light on Merced," Electronic Engineering Times, Feb. 15, 1999, pp. 43–44.

* cited by examiner

Primary Examiner—Matthew Smith
Assistant Examiner—Phallaka Kik

(57) ABSTRACT

A method and system for inserting in-place interconnect repeaters along the paths of interconnects of an integrated circuit is presented. The integrated circuit includes an interconnect layer on which an interconnect is routed, a silicon layer in which repeaters are implemented, and zero or more intervening layers. In accordance with the invention, reserved metal areas are defined on each intervening layer that resides between the interconnect layer and the repeater layer. Each interconnect net that requires a repeater for performance reasons is assigned to a repeater location. A repeater buffer is inserted at the assigned repeater locations. The interconnect net is cut into first and second subnets, which are then respectively connected through the reserved metal areas of the intervening layers to the respective input and output port of the repeater buffer.

16 Claims, 9 Drawing Sheets

IN-PLACE METHOD FOR INSERTING REPEATER BUFFERS IN AN INTEGRATED CIRCUIT

FIELD OF THE INVENTION

The present invention pertains generally to interconnect routing in integrated circuit design, and more particularly to a method for inserting in-place interconnect repeaters in integrated circuits.

BACKGROUND OF THE INVENTION

Integrated circuits comprise a plurality of electronic components that function together to implement a higher-level function. ICs are formed by implanting a pattern of transistors into a silicon wafer which are then connected to each other by layering multiple layers of metal materials, interleaved between dielectric material, over the transistors. The fabrication process entails the development of a schematic diagram that defines the circuits to be implemented. A chip layout is generated from the schematic. The chip layout, also referred to as the artwork, comprises a set of planar geometric shapes over several layers that implement the circuitry defined by the schematic. A mask is then generated for each layer based on the chip layout. Each metal is then successively layered over the silicon wafer according to the layer's associated mask using a photolithographical technique.

The process of converting the specifications of an electrical circuit schematic into the layout is called the physical design process. CAD tools are extensively used during all stages of the physical design process. The physical design process is accomplished in several stages including partitioning, floorplanning, and routing.

During the partitioning stage, the overall integrated circuit is partitioned into a set of functional subcircuits called blocks. The block partitioning process considers many factors including the number and size of the blocks, and number of interconnections between the blocks. The output of partitioning is a set of blocks along with a set of interconnections required between blocks, referred to herein as a netlist.

During the floorplanning stage, a floorplan is developed defining the placement and rectangular shape of each block. The goal of the floorplanning stage is to select the optimal layout for each block, as well as for the entire chip.

Once an acceptable floorplan is developed, the interconnections between the blocks (as defined by the netlist) are routed. The space not occupied by the blocks is partitioned into rectangular regions referred to as channels. Interconnects are preferably routed within the designated channels, but may also be routed through defined feedthroughs through the blocks, or in defined over-the-block routing space.

The goal of a router is to complete all circuit connections resulting in minimal interconnect signal delay. Where possible, the router will generally attempt to route individual interconnects on a single layer; however, if this is not achievable given the topology of the netlist, an interconnect may be routed over two or even more layers. Often, interconnect routes resulting from the autorouting will be too long to meet signal delay specifications. The delay results from the inherent RC characteristics of the interconnect line. Signal transition time can often be significantly improved by introducing one or more signal repeaters along the path of the interconnect line.

Over the past decades, integrated circuits (ICs) of increasingly higher density have been developed to meet industry demands of higher performance and smaller packaging. The very high densities of today's integrated circuits means that more metal layers and interconnects per layer are required than ever before. The result is that the routing task has become even more complex, often resulting in a higher number of interconnects that do not meet the timing criteria, and therefore an increasingly higher number of required repeaters. When over-the-block routing is employed, the insertion of repeaters along the over-the-block interconnects is problematic due to the need to be able to connect from the metal layer on which the problem interconnect resides, through any intervening layers, to the repeaters ports.

On previous channel-routed ICs, the conventional process for inserting repeaters involved the process of routing the interconnects without insertion of repeaters, extracting the timing for the interconnects, determining the placement of repeaters to improve unacceptable timing paths (usually by simulating with a CAD tool such as SPICE), and adding the repeaters one at a time to the schematic and artwork to create a new netlist. The new netlist was then resubmitted to the router and the process repeated. It will be noted that the second route (with repeaters) typically results in a routing solution that is quite different from the initial route, and therefore often contains unacceptable net propagation delays due to the re-route. In other words, the optimal repeater solution for the initial route will not necessarily be the optimal repeater solution for the second route. Accordingly, the rip-up and re-route process is typically repeated, feeding the router the netlist generated on the previous iteration of the process, until all interconnects satisfactorily meet the timing criteria. Because the previous routing solution is not preserved when the router routes the new netlist, this process is often referred to as "rip-up and re-route".

Importantly, as just described, new repeaters are added to the netlist and schematic on each iteration of the process. Each time a repeater is added to the schematic, two separate new nets replace the original net, one of which connects to the input port of the repeater, and the other of which connects to the output port of the repeater. Accordingly, it will be appreciated that the number of nets and number of connections that the router must route increases by at least two for each repeater inserted. Because the updated netlist with the additional nets and connections is then resubmitted to the router in the prior art, the routing problem faced by the router becomes more complex for each successive iteration of the rip-up and re-route process. For example, suppose the original netlist comprises 15K nets and 30K connections. If after the first iteration the router determines that each net requires one repeater, the new netlist will comprise twice the number of nets and connections (30K nets and 60K connections) as the original netlist. It is clear that the routing problem submitted to the router becomes increasingly difficult on each iteration of the rip-up and re-route process as the netlist gets updated to accommodate new repeaters on each iteration.

It is therefore and object of the invention to eliminate the iterative rip-up and re-route process by providing a methodology for allowing in-place insertion of repeaters along an interconnect.

In order to make the repeater farms usable, the nets must be able to connect from the interconnect layer through the intervening metal layers to the repeater ports. For this to be possible, necessary resources must be reserved for connections to repeaters on each intervening layer.

It is therefore an object of the invention to provide an efficient method for performing in-place repeater insertion.

It is also an object of the invention to ensure the highest performance of the inserted repeaters to avoid unnecessary propagation delay due to lengthy routing of the signal from the net on the interconnect layer down through each metal layer to the repeater and back up again.

SUMMARY OF THE INVENTION

The present invention is a novel method and system for performing in-place insertion of interconnect repeater buffers along routed nets of an integrated circuit. The invention is ideal for use to eliminate the iterative rip-up and re-route process. The methodology of the invention also ensures minimal net detour between the originally routed net and the repeater, thereby reducing signal delay.

In accordance with the invention, a set of legal repeater locations is defined for each interconnect net. Reserved metal areas are defined on all metal layers that reside between the interconnect layer and the silicon layer on which the repeater is implemented. Legal repeater locations are calculated for each net. Preferably, repeaters are confined to reside within repeater farms, and the legal repeater locations are those locations along each net that passes over the repeater farms. Repeater locations are assigned to each net that requires a repeater, giving priority to those nets that have the most need for the repeaters. A repeater buffer is inserted at each of the assigned locations, and the nets are cut and connected to the repeater buffers on the silicon layer. The power and ground is distributed to the repeater farms, and the leftover repeater cell positions are filled with by-pass capacitors.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel method and system for performing in-place insertion of interconnect repeater buffers in a routing net of an integrated circuit is described in detail hereinafter. Although the invention is described in terms of specific illustrative embodiments, it is to be understood that scope of the invention is not limited thereby.

Figure 1:
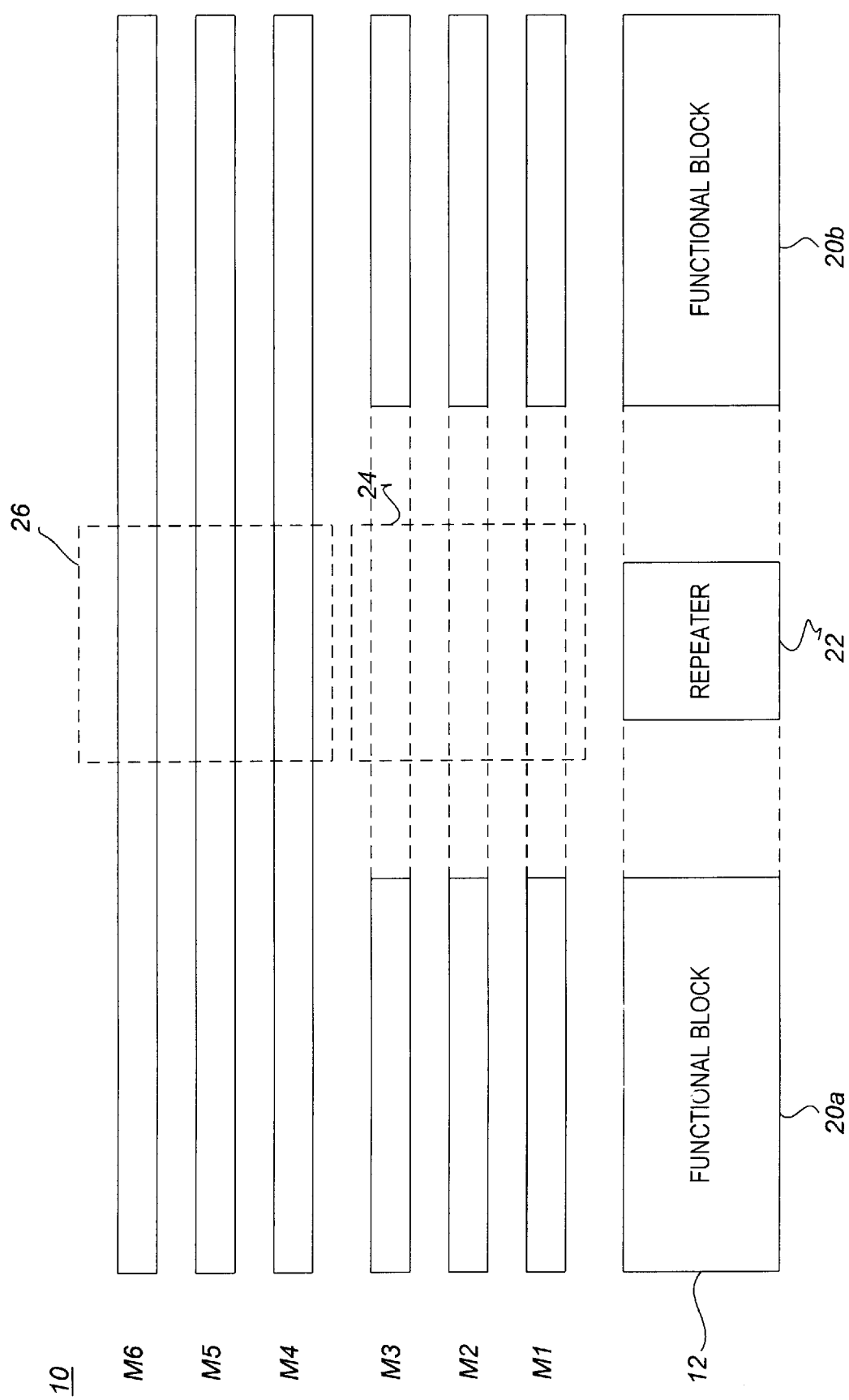
FIG. 1 is a side view of a portion of an integrated circuit illustrating an interconnect layer above a silicon substrate.

FIG. 1 is a side view of a portion of an integrated circuit (IC) 10. IC 10 comprises functional blocks 20a and 20b implemented in silicon layer 12. Metal layers M1–M6, sandwiched with intervening dielectric layers (not shown), are layered one on top of the other as illustrated. The metal on each layer M1–M6 is preferably formed in parallel tracks, where the direction of the tracks in adjacent layers is orthogonal.

Generally, the lowest level metal layers are used by local block interconnects, i.e., intra-block signals, and higher-level metal layers are used by inter-block interconnects. In the illustrated example, metal layers M1–M3 are used for intra-block routing, while layers M4–M6 are used for inter-block routing.

As described in the background section, repeaters are used to improve propagation delay and signal transition times. In the example of FIG. 1, IC 10 includes repeater buffer 22 implemented in the channel between blocks 20a and 20b. In order for an interconnect net on one of the upper layers M4–M6 to connect to the repeater 22 on the silicon layer, a connection must be made through any intervening metal layers between the net and the ports of the repeater. To make the necessary net-to-port connections, some metal on each layer between the net to be connected and the repeater ports must be set aside especially for this purpose.

It will be appreciated from the diagram of FIG. 1 that tracks over the repeaters 22 on the local interconnect layers M1–M3 (shown generally at 24) are typically available for connection to repeaters since all the intra-block interconnects tend to run directly over-the-block and tend not to run over the neighboring channels. However, in the upper metal layers (e.g., M4–M6), the inter-block interconnects run between the blocks and therefore compete for the resources in the area directly over the repeaters. Therefore, unless metal tracks in the inter-block interconnect layers M4–M6 are specifically set aside on each of those layers for repeater connections, it is unlikely that the necessary resources in these layers will be available for stitching in a repeater after the autorouting is completed.

Figure 2:
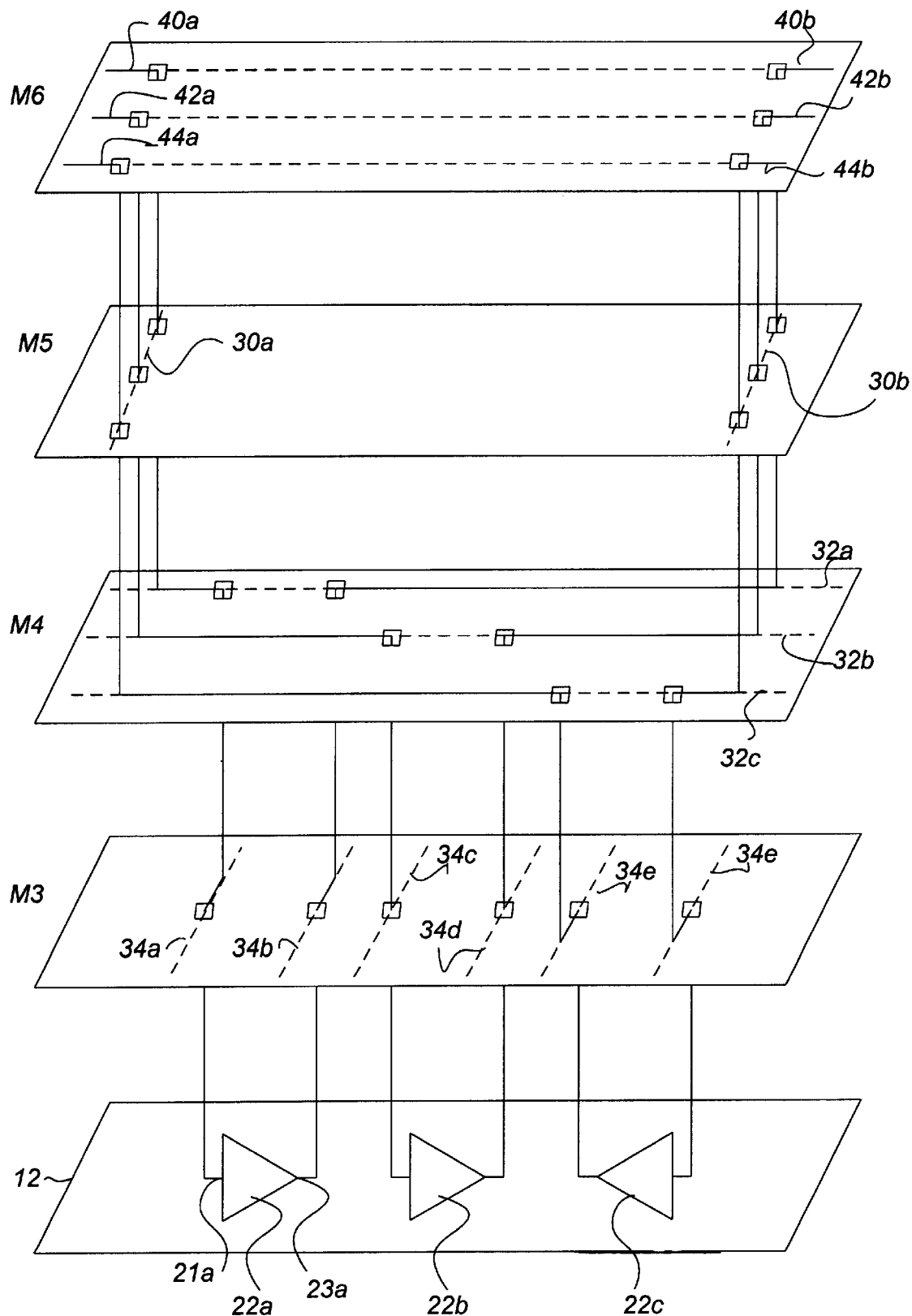
FIG. 2 is a perspective side view of a portion of the integrated circuit of FIG. 1.

FIG. 2 is a perspective view of a portion of IC 10 showing the break-out of the different layers. FIG. 2 shows a set of top-level interconnects 40, 42, and 44 located on metal layer M6 stitched to respective repeaters 22a, 22b, 22c. As illustrated, each intervening metal layer M5, M4 and M3 (local layers M2 and M1 are assumed but not shown for simplicity) between the layer M6 on which the interconnect lies and the repeater ports each have tracks set aside specifically for use for interconnect-to-repeater connections. In the example shown in FIG. 2, metal layer M5 comprises set aside tracks 30a and 30b; metal layer M4 comprises set aside tracks 32a, 32b, and 32c; and metal layer M3 comprises set aside tracks 34a, 34b, 34c, 34d, 34e, and 34f. The repeater ports in this example are available at metal layer M3. Layers M2 and M1 comprises similar set aside tracks which complete the connections to the repeaters 22a, 22b, 22c. After stitching, interconnect 40 comprises two separate nets 40a and 40b. Net 40a connects through layers M5 (along set aside track 30a), M4 (along set aside track 32a), M3 (along set aside track 34a), M2 and M1 (not shown), to the input port 21a of repeater 22a. Net 40b connects through layers M5 (along set aside track 30b), M4 (along set aside track 32a), M3 (along set aside track 34b), M2 and M1 (not shown), to the output port 23a of repeater 22a. Interconnects 42 and 44 are similarly separated into separate nets 42a, 42b, and 44a, 44b respectively. They are similarly connected to respective repeaters 22b and 22c as illustrated.

Figure 3:
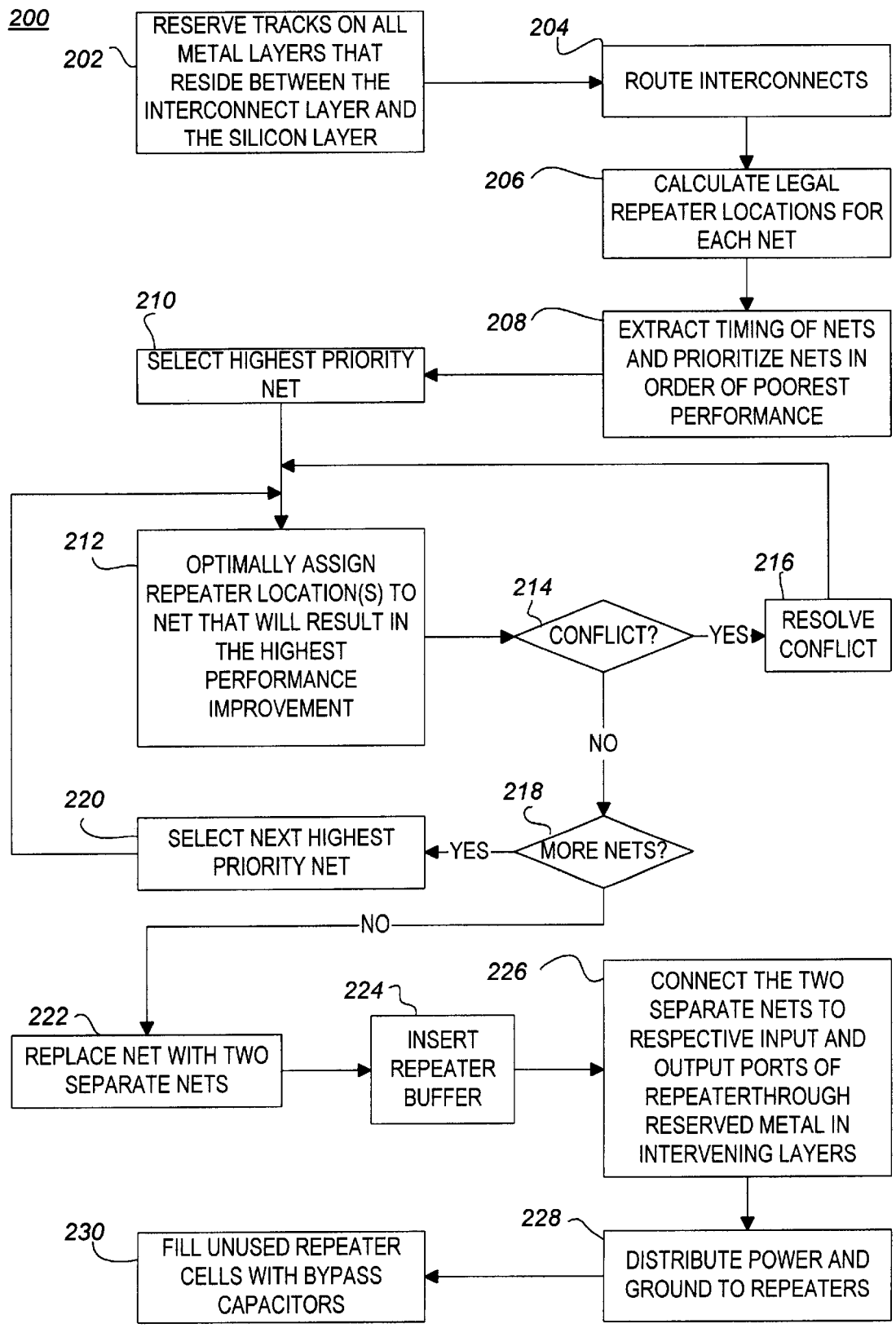
FIG. 3 is an operational flowchart of one embodiment of the invention for in-place insertion of interconnect repeaters.

FIG. 3 is a flowchart of the general method 200 of the invention for inserting in-place interconnect repeaters. In order to allow in-place stitching, specially designated repeater connection metal must be reserved 202 on all metal layers that reside between the top-level interconnect layer and the silicon layer. The reserved metal may be entire tracks reserved especially for repeater connections, or may be portions of tracks that are used for additional purposes. The reserved metal must be positioned such that the reserved metal in each adjacent layer can connect to one another and ultimately to reserved repeater areas in the silicon. In the preferred embodiment, the reserved repeater connection tracks are laid out in parallel in each layer, and tracks in each adjacent layer are orthogonal to one another.

The interconnects are routed 204 to generate a list of interconnect nets 103. Legal repeater locations 111 are calculated 206 for each net in the list. In the preferred embodiment, these locations are identified as those portions of the net that passes over a repeater farm.

The timing of each net is extracted and the nets are prioritized 208 in order of poorest performance having highest priority. The highest priority net (i.e., the net that is in most need of a repeater) is selected 210 and one of the net's legal repeater locations is selected and assigned 212 to the net. Preferably, the selected repeater location will result in the highest performance improvement to the net. If more nets exist to be processed 218, the next highest priority net is selected 220 and one of its legal repeater locations is selected and assigned 212 to the next highest priority net. Again, the selected repeater location I s the legal repeater location that will result in the highest performance improvement to the net. If the selected location has already been assigned to a previously processed net 214, the conflict is resolved 216, if possible.

Figure 4:
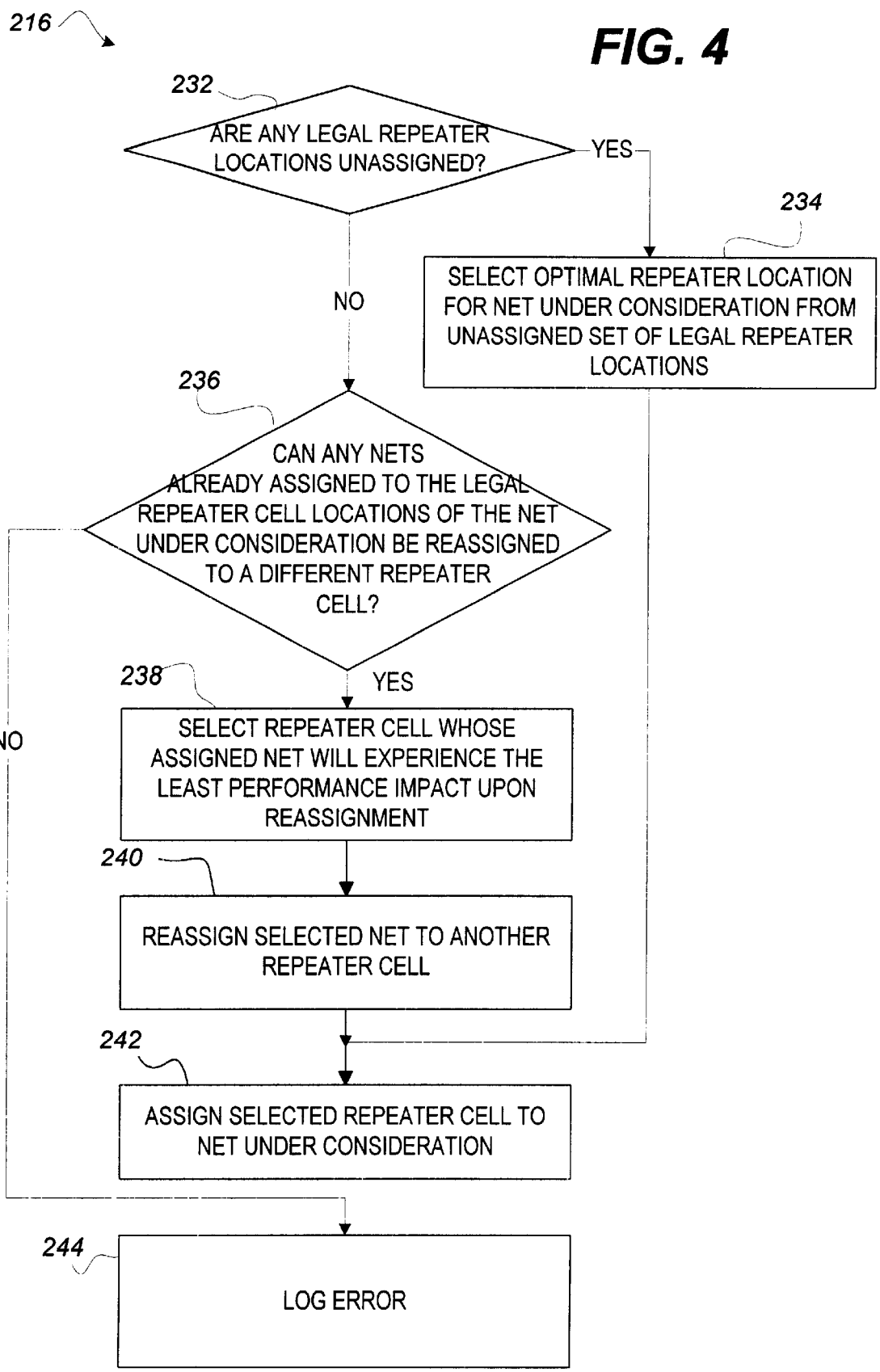
FIG. 4 is an operational flowchart of one embodiment of the method for assigning repeater locations to nets.

FIG. 4 is an illustrative embodiment of one method for resolving repeater location conflicts 216. Under this scheme, a check is made 232 to determine whether any of the legal repeater locations for the net under consideration are as yet unassigned to other nets. If any of the legal repeater locations for the net under consideration are as yet unassigned to another net, the optimal legal repeater location in terms of performance criteria from among the set of unassigned repeater cells is selected 234.

If all legal repeater locations are already assigned to other nets, an attempt is made 236 to reassign one of the nets occupying a legal repeater location of the net under consideration to a different repeater cell from among the set of legal repeater locations of the other net. Preferably, from among those nets assigned to each of the legal repeater cell locations of the net under consideration, the net that will suffer the least by a repeater cell reassignment is selected 238 for reassignment and reassigned 240 to another legal repeater location for that net. If none of the legal repeater cells can be reassigned to accommodate the net being assigned, an error is logged 242.

Referring back to FIG. 3, once the conflict is resolved 216, steps 212 through 218 are repeated until all nets have been processed. Once all the nets have been assigned repeater locations, the nets are cut, replacing each net requiring a repeater into two separate nets 222. A repeater buffer is inserted 224 at each assigned repeater location, and then its input and output ports are respectively connected to the two cut nets that replace its assigned net. Power and ground is distributed 228 to each of the repeaters, and all unused repeater locations are filled 230 with bypass capacitors.

Figure 5:
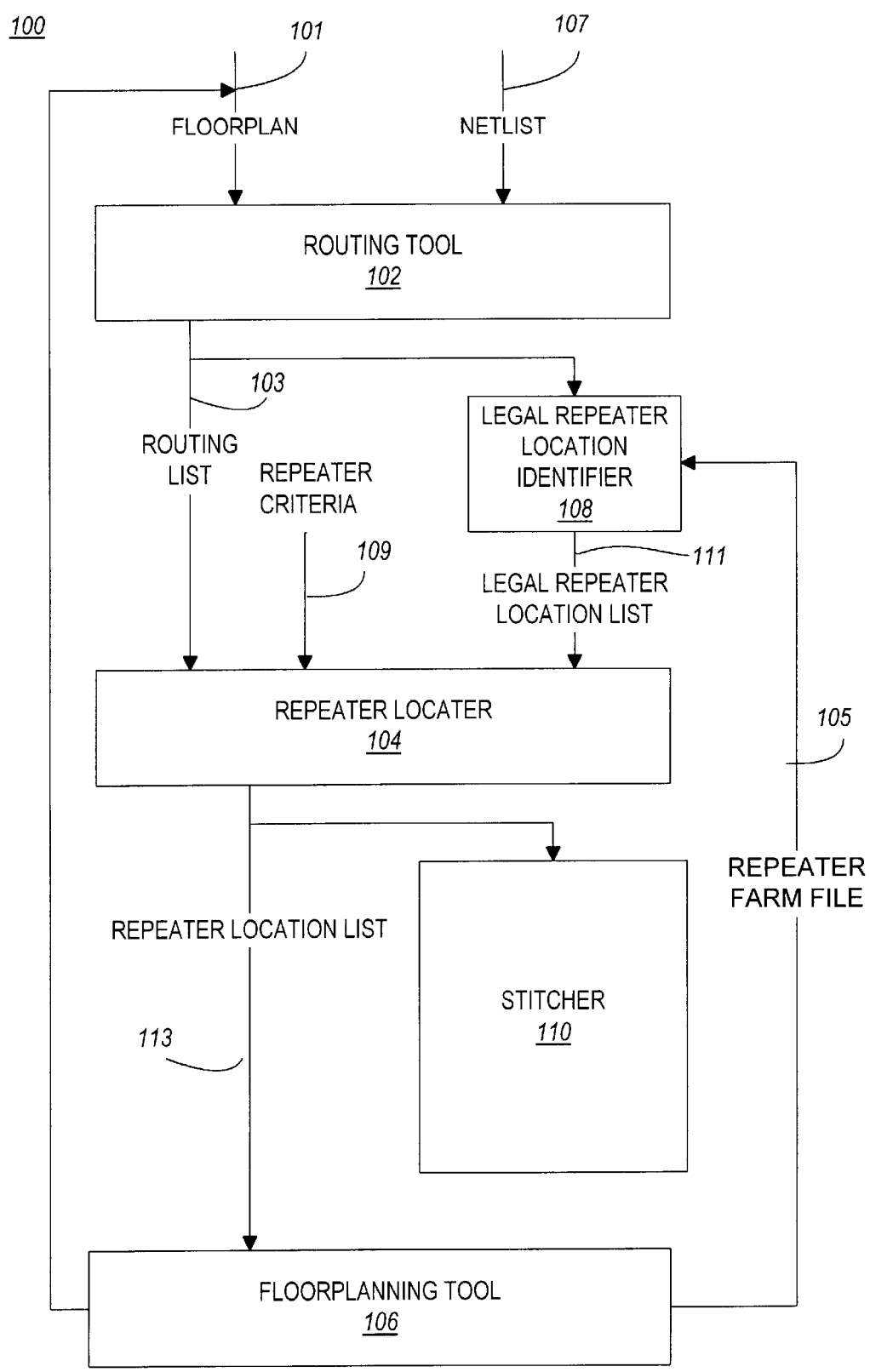
FIG. 5 is a block diagram of an illustrative embodiment of a system implementing the invention.

FIG. 5 is a block diagram of an illustrative embodiment of a system 100 which implements the method of the invention. System 100 includes a routing tool 102, a repeater locator tool 104, a legal repeater location identifier tool 108, a graphical floorplan tool 106, and a repeater stitcher tool 110. In the illustrative embodiment, routing tool 102 is embodied by IC Craftsman, manufactured by Cadence Corp. Repeater locator tool 104 is embodied by a proprietary tool call SPO which implements the method described in detail in U.S. Pat. application Ser. No. 09/329,556 to Wanek et al., entitled "Interactive Repeater Insertion Simulator", filed Jun., 10, 1999, and is incorporated herein by reference for all that it teaches.

Routing tool 102 routes the interconnects defined by a netlist 107 and a floorplan 101 of a previously mapped layout (e.g., using the floorplan tool 106) within the routing regions, which include channels, feedthroughs, and over-the-block regions. Routing tool 102 generates a routing list 103 which defines the interconnect nets generated during the routing process.

Legal repeater location identifier tool 108 determines a set of legal repeater locations for each net in the routing list 103 based on information from the floorplanning tool 106 that describes the legal areas for inserting repeaters. Preferably, this is in the form of a repeater farm file 105 which defines the set aside areas for repeaters. Legal repeater location identifier tool 108 generates a legal repeater location list 111 identifying the set of legal repeater locations for each net that passes over a repeater farm.

Repeater locator tool 104 implements an algorithm that determines the repeater locations of each interconnect net of routing list 103 when constrained to locations in the net's corresponding legal repeater location set from legal repeater location list 111 based on a set of user-defined repeater criteria 109 such as propagation delay, transition times, and required repeater size. Repeater locator tool 104 generates a repeater location list 105 containing the optimal constrained locations for each net.

Stitcher 110 stitches a repeater in-place on each net at its assigned repeater location as defined in the repeater location list 105.

Graphical floorplan tool 106 provides a positional view of the repeater locations designated in the repeater location list 105 with respect to the overall floorplan 101, the netlist 107, and repeater criteria 109 at the locations defined in the repeater location list 105.

Figure 6:
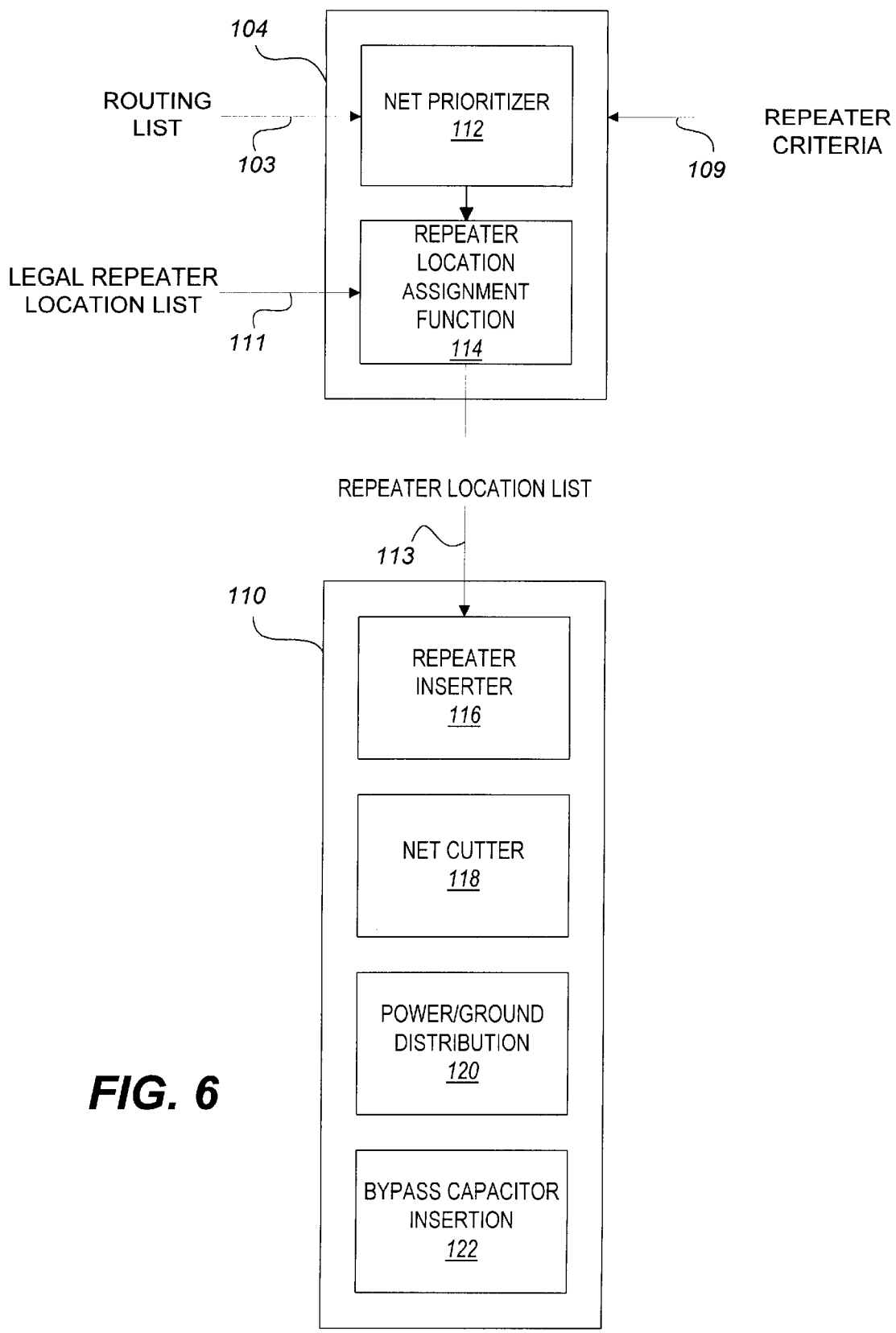
FIG. 6 is a more detailed block diagram of the repeater locator tool and stitcher.

FIG. 6 is a more detailed block diagram illustrating portions of repeater locator tool 104 and stitcher 110. As illustrated, repeater locator tool 104 comprises a net prioritizer 112 and a repeater location assignment function 114. Net prioritizer 112 prioritizes the nets in the routing list 103 in order of poorest performance first. Repeater location assignment function 114 determines the optimal repeater locations for each net in accordance with steps 212–216 of FIG. 3 and steps 232–244 of FIG. 4.

Stitcher 110 includes repeater insertion function 116 which inserts a repeater buffer at each of the assigned repeater locations, and a net cutter 118 that replaces each net requiring a repeater with two separate nets and connects the two separate nets to the respective input and output port of its associated repeater. Preferably, stitcher 110 also includes a power distribution function which connects the repeaters to the power and ground grids. A bypass capacitor insertion function 122 inserts bypass capacitors in all the unused repeater locations in the repeater farms.

FIGS. 7A–7F are diagrams illustrating various CAD tool screens at various stages in the process of the invention.

Figure 7A:
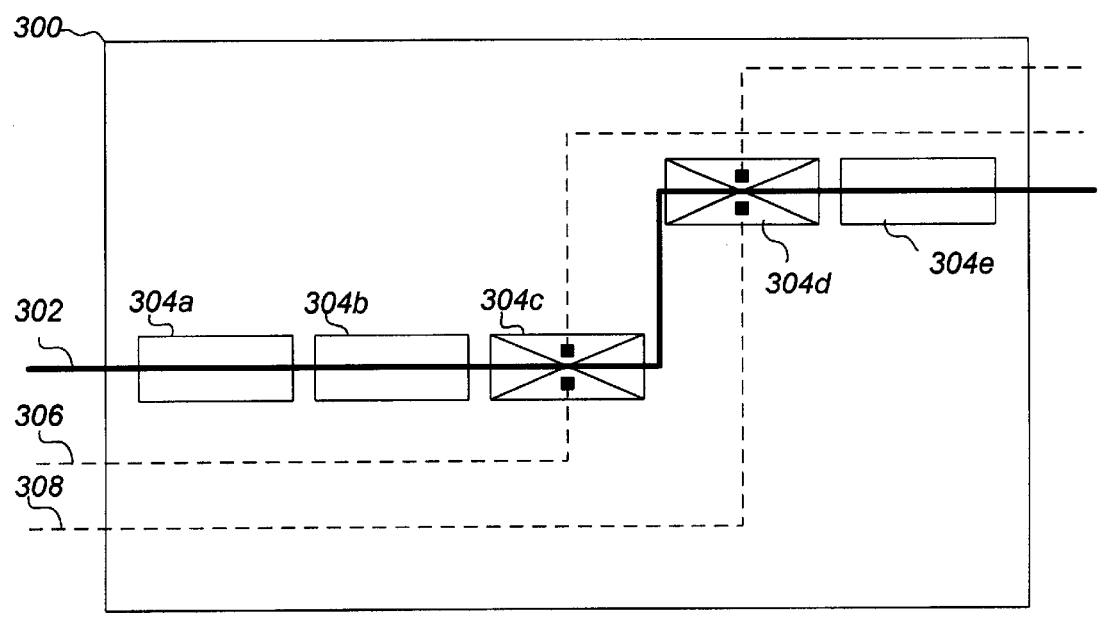
FIG. 7A is a floorplan view of a repeater farm illustrating the legal repeater cell locations for a net.
Figure 7B:
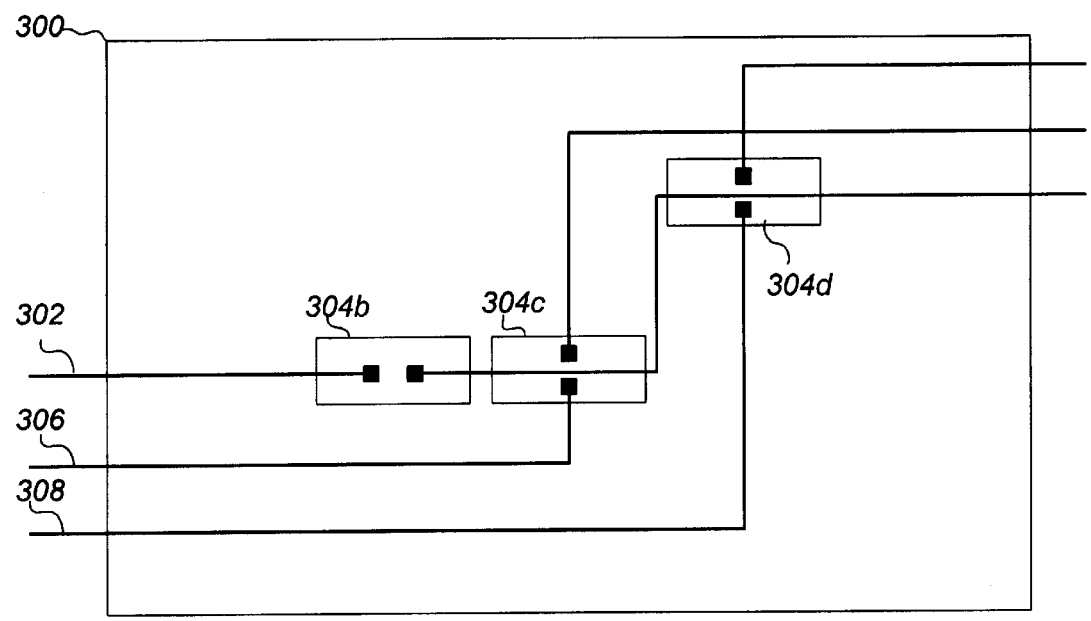
FIG. 7B is a floorplan view of the net and repeater farm of FIG. 7A illustrating the assigned repeater cell locations for the net.

FIG. 7A is a floorplan view of repeater farm 300 illustrating the legal repeater cell locations for a net 302 as defined by the valid repeater location list 113 for net 302. In this example, repeater cell locations 304c and 304d have been previously assigned, as indicated by the crosses in these locations, to higher priority nets 306 and 308 respectively. Also in this example, the repeater location assignment function 114 (FIG. 5) calculates the optimal repeater cell location for net 302 to be repeater cell location 304c. However, since location 304c is already assigned to higher priority net 306, the next optimal location is calculated, in this example to be repeater cell location 304b. Since repeater cell location 304b is available for assignment, it is assigned to net 302, as illustrated in FIG. 7B.

Figure 7C:
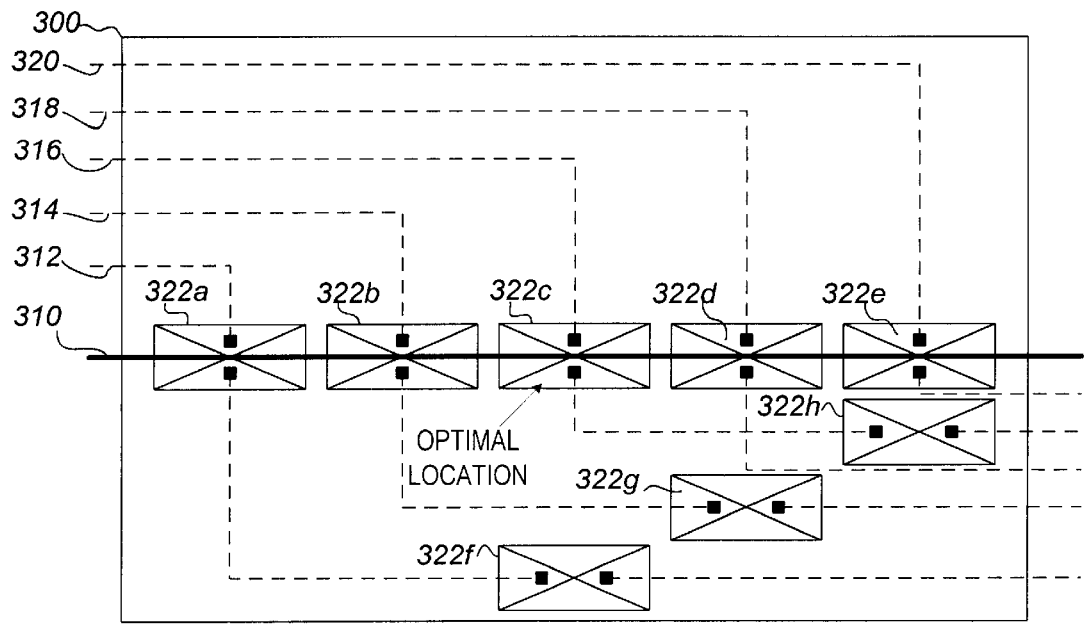
FIG. 7C is a floorplan view of a repeater farm illustrating the legal repeater cell locations for another net that are all previously assigned to higher priority nets.
Figure 7D:
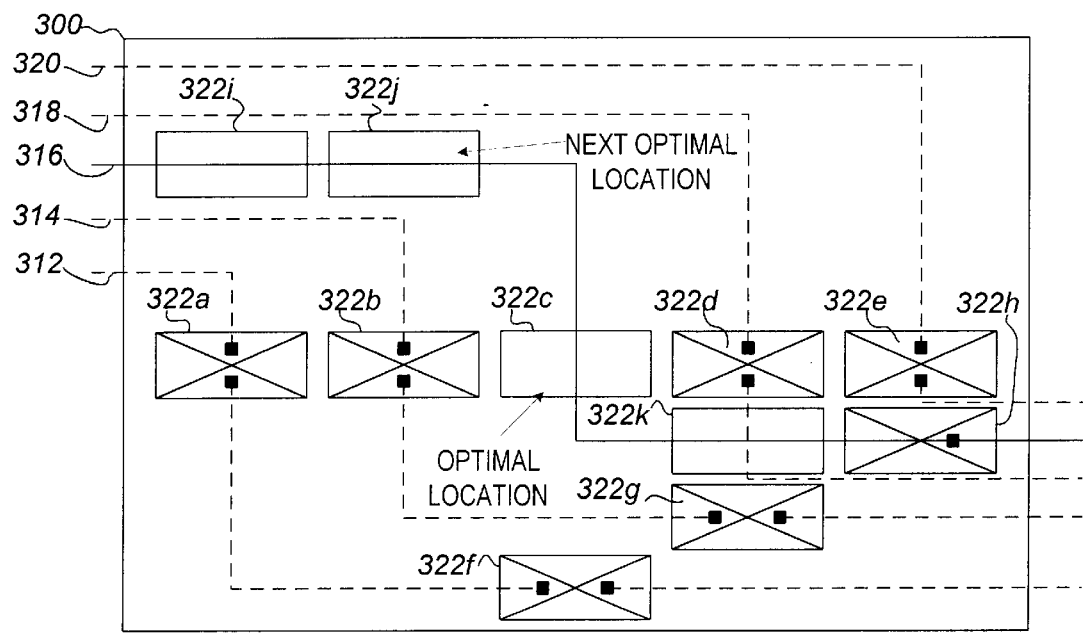
FIG. 7D is a floorplan view of the repeater farm of FIG. 7C illustrating the legal repeater cell locations for a higher priority net.

FIG. 7C illustrates another example in which each of the legal repeater locations 322a, 322b, 322c, 322d, and 322e of net 310 are previously assigned to higher priority nets 312, 314, 316, 318, and 320 respectively. Also in this example, the repeater location assignment function 114 (FIG. 5) calculates the optimal repeater cell location for net 310 to be repeater cell location 322c. However, since location 322c is already assigned to higher priority net 316, conflict resolution must be performed. In accordance with the conflict resolution method of FIG. 4, it is determined that none of the legal repeater locations 322a, 322b, 322c, 322d and 322e of net 310 are available for assignment.

Figure 7E:
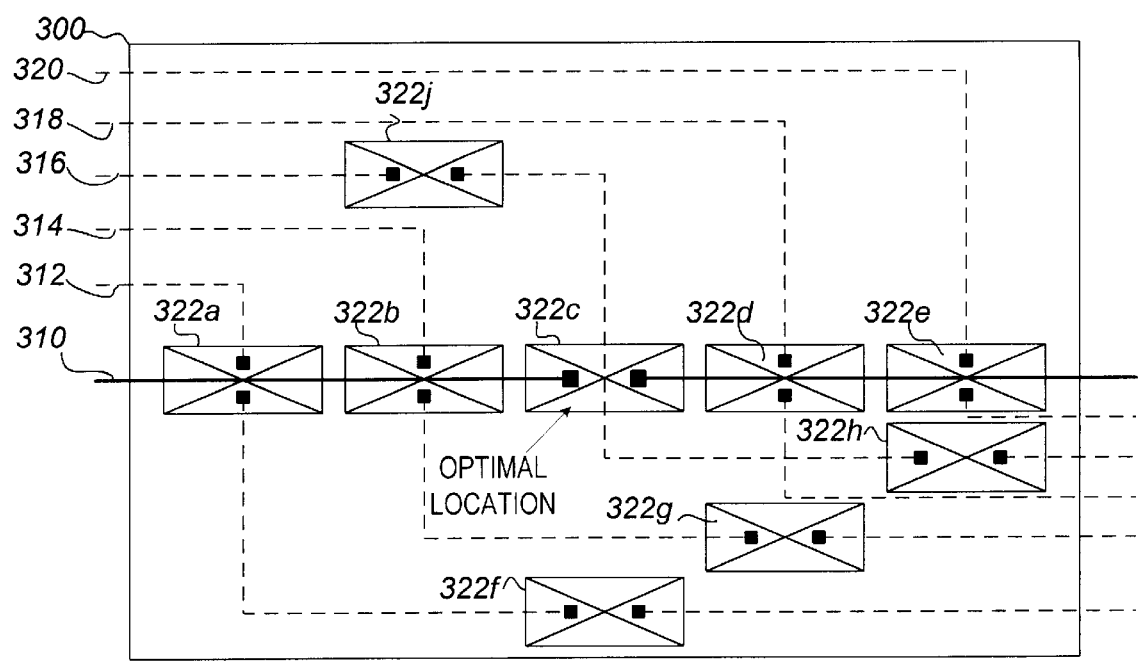
FIG. 7E is a floorplan view of the nets of FIGS. 7C and 7D illustrating the reassignment of repeater cell locations to accommodate the lower priority net.

Accordingly, it is also determined that the reassignment of net 316 among all the higher priority nets 312, 314, 316, 318, and 320 will have the least impact on the performance of the nets. Net 316 has available legal repeater locations 322l, 322j, and 322k, ass illustrated in FIG. 7D, and it is determined that the reassignment of net 316 from repeater cell location 322c to repeater cell location 322j will have the least performance impact on net 316. Repeater cell location 322j is assigned to net 316 and repeater cell location 322c is reassigned to net 316, as illustrated in FIG. 7E. Accordingly, the nets are optimally assigned given the routing list 103 and legal repeater locations 111 available for each net.

The method and system for optimally performing in-place insertion of repeater buffers along interconnect routing paths during the physical design of an integrated circuit described in detail above achieves several advantages over the prior art. The ability to perform in-place repeater insertion eliminates the iterative re-routing process of the prior art. In addition, the reservation of metal for use for repeater connection in the intervening layers ensures minimal net detour between the net and repeater, which effectively decreases interconnect signal propagation delay and transition times over repeater connection methodologies of the prior art.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. An in-place method for inserting interconnect repeaters along paths of interconnects of an integrated circuit, said integrated circuit comprising an interconnect layer on which an interconnect is routed, a silicon layer in which repeaters are implemented, and one or more intervening layers, said method comprising the steps of:

reserving metal on each of said intervening layers that reside between said interconnect layer and said silicon layer;

assigning a repeater location to an interconnect net that requires a repeater buffer;

inserting a repeater buffer at said assigned location, said repeater buffer comprising an input port and an output port;

cutting said interconnect net into a first subnet and a second subnet;

connecting said first subnet to said input port through said reserved metal in each of said intervening layers; and connecting said second subnet to said output port through said reserved metal in each of said intervening layers.

2. The method of claim 1, wherein said assigning step comprises:

selecting said assigned repeater location to be a first repeater location from among a set of legal repeater locations.

3. The method of claim 2, wherein:

said first repeater location is an optimal repeater location from among said set of legal repeater locations.

4. The method of claim 2, further comprising:

determining whether said selected repeater location is available for assignment; and if said selected repeater location is unavailable for assignment, selecting said assigned repeater location to be a next repeater location from among said set of legal repeater locations.

5. The method of claim 4, wherein:

said first repeater location is an optimal repeater location from among said set of legal repeater locations.

6. The method of claim 5, wherein:

said next repeater location is a next optimal repeater location from among said set of legal repeater locations.

7. The method of claim 4, wherein:

said determining step and said selecting step if said selected repeater location is unavailable are repeated until one of said repeater locations in said set of legal repeater locations is selected or until it is determined that none of said repeater locations in said set of legal repeater locations are available for assignment.

8. The method of claim 7, wherein:

said first repeater location is an optimal repeater location from among said set of legal repeater locations.

9. The method of claim 8, wherein:

said next repeater location is a next optimal repeater location from among said set of legal repeater locations.

10. The method of claim 7, further comprising:

processing a set of interconnect nets each of which require a repeater, said processing step comprising repeating said assigning step through said step of connecting said second subnet for each interconnect net in said set of interconnect nets.

11. The method of claim 10, comprising:

prioritizing the processing of said set of interconnect nets in order of how poorly each interconnect net in said set of interconnect nets meets a pre-defined performance criteria.

12. The method of claim 11, wherein:

if in said determining step it is determined that none of said legal repeater locations are available for assignment, an assigned repeater location corresponding to a previously processed net is assigned to said interconnect net being processed and a different repeater location in said set of legal repeater locations corresponding to said processed net is reassigned to said processed net.

13. The method of claim 2, wherein:

said set of legal repeater locations each reside in a repeater farm.

14. A system for inserting in-place interconnect repeaters along paths of interconnects of an integrated circuit, said integrated circuit comprising an interconnect layer on which an interconnect is routed, a silicon layer in which repeaters are implemented, and one or more intervening layers each comprising a reserved metal area for repeater connection, said system comprising:

a repeater assignment function which assigns a repeater location to an interconnect net that requires a repeater buffer port and an output port;

a stitcher which inserts a repeater buffer at said assigned location, cuts said interconnect net into a first subnet and a second subnet, and connects said first subnet to said input port through a first subset of said reserved metal areas in each of said intervening layers and said second subnet to said output port through a second subset of said reserved metal areas in each of said intervening layers.

15. The system of claim 14, further comprising:

a net prioritizer which prioritizes a set of interconnect nets in order of how poorly each interconnect net in said set of interconnect nets meets a pre-defined performance criteria; and a processor which processes the set of interconnect nets through said repeater assignment function and said stitcher.

16. The system of claim 14, further comprising:

a repeater locator tool which calculates a set of legal repeater locations for an interconnect net, said set of legal repeater locations comprising all of the legal repeater locations that will result in acceptable interconnect signal performance for said interconnect net, wherein said repeater assignment function constrains said repeater location assignment to said set of legal repeater locations.

* * * * *